US012578388B2

(12) United States Patent
Kim

(10) Patent No.: US 12,578,388 B2
(45) Date of Patent: Mar. 17, 2026

(54) CIRCUIT BOARD FOR BATTERY MONITORING CIRCUIT AND WIRE HARNESS FOR CONNECTION THEREWITH

(71) Applicant: LG Energy Solution, Ltd., Seoul (KR)

(72) Inventor: Duk-You Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 168 days.

(21) Appl. No.: 18/699,666

(22) PCT Filed: Jul. 14, 2023

(86) PCT No.: PCT/KR2023/010129
§ 371 (c)(1),
(2) Date: Apr. 9, 2024

(87) PCT Pub. No.: WO2024/058391
PCT Pub. Date: Mar. 21, 2024

(65) Prior Publication Data
US 2024/0402252 A1 Dec. 5, 2024

(30) Foreign Application Priority Data

Sep. 15, 2022 (KR) ........................ 10-2022-0116492

(51) Int. Cl.
G01R 31/36 (2020.01)
G01R 31/3835 (2019.01)
(Continued)

(52) U.S. Cl.
CPC ..... G01R 31/3644 (2013.01); G01R 31/3835 (2019.01); H01M 50/569 (2021.01)

(58) Field of Classification Search
CPC .. G01R 31/36; G01R 31/364; G01R 31/3835; G01R 31/396; G01N 27/416; H01M 50/569
See application file for complete search history.

(56) References Cited

U.S. PATENT DOCUMENTS 5,112,239 A 5/1992 Yagi et al.
6,304,062 B1 10/2001 Batson
(Continued)

FOREIGN PATENT DOCUMENTS

CN 103618353 A 3/2014
CN 204028329 U 12/2014
(Continued)

OTHER PUBLICATIONS

International Search Report for Application No. PCT/KR2023/010129 mailed Oct. 18, 2023, pp. 1-3.
(Continued)

*Primary Examiner* — Neel D Shah
(74) *Attorney, Agent, or Firm* — Lerner David LLP

(57) ABSTRACT

Disclosed are a circuit board for a battery monitoring circuit and a wire harness for connection therewith. The battery monitoring circuit includes first to (M+1)-th voltage sensing pins, operating on a condition that a voltage is applied to (M−N+1) to (M+1)-th voltage sensing pins among the first to (M+1)-th voltage sensing pins. The circuit board includes first to (M+1)-th conducting patterns formed electrically separably from each other, and electrically connected, at an end, to each of the first to (M+1)-th voltage sensing pins, respectively, a relay conducting pattern, wherein an end of the relay conducting pattern is electrically connected to (M−N+1)-th conducting pattern electrically connected to the (M−N+1)-th voltage sensing pin among the first to (M+1)-th conducting patterns, first to (M+1)-th board terminals, each of the first to (M+1)-th board terminals being electrically connected to an opposite end of each of the first to (M+1)-th conducting patterns.

10 Claims, 5 Drawing Sheets

(51) Int. Cl.
    *G01R 31/396*      (2019.01)
    *H01M 50/569*      (2021.01)

(56)          References Cited

U.S. PATENT DOCUMENTS

| | | |
|---|---|---|
| 2013/0300371 A1 | 11/2013 | Bills |
| 2016/0261007 A1 | 9/2016 | Furukawa et al. |
| 2020/0358142 A1* | 11/2020 | Bae .................. H01M 10/4264 |
| 2020/0408814 A1 | 12/2020 | Hatani et al. |
| 2021/0247461 A1 | 8/2021 | Park |
| 2023/0042107 A1 | 2/2023 | Kim et al. |
| 2023/0251315 A1 | 8/2023 | Jo et al. |
| 2024/0079749 A1 | 3/2024 | Kawai et al. |

FOREIGN PATENT DOCUMENTS

| | | |
|---|---|---|
| JP | 5287682 B2 | 9/2013 |
| JP | 5712841 B2 | 5/2015 |
| JP | 2018082535 A | 5/2018 |
| KR | 20020044170 A | 6/2002 |
| KR | 20180007560 A | 1/2018 |
| KR | 20200086956 A | 7/2020 |
| KR | 20220045701 A | 4/2022 |
| KR | 20220105949 A | 7/2022 |
| WO | 2022163478 A1 | 8/2022 |

OTHER PUBLICATIONS

Extended European Search Report including Written Opinion for Application No. 23865694.6 dated Feb. 17, 2025. 9 pages.

\* cited by examiner

CIRCUIT BOARD FOR BATTERY MONITORING CIRCUIT AND WIRE HARNESS FOR CONNECTION THEREWITH

CROSS-REFERENCE TO RELATED APPLICATION

The present application is a national phase entry under 35 U.S.C. § 371 of International Application No. PCT/KR2022/011055 filed Jul. 27, 2022, which claims priority from Korean Patent Application 10-2021-0102178 filed Aug. 3, 2021, all of which are incorporated herein by reference.

TECHNICAL FIELD

The present disclosure relates to a circuit board for a battery monitoring circuit and a wire harness for connection therewith, and more particularly, to a circuit board for mounting a battery monitoring circuit provided to monitor the state of a set of battery cells connected in series, and a wire harness connecting the set of battery cells connected in series to the circuit board.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be repeatedly recharged.

Currently, commercially available batteries include nickel-cadmium batteries, nickel-hydrogen batteries, nickel-zinc batteries, lithium secondary batteries and the like, and among them, lithium batteries have little or no memory effect, and thus they are gaining more attention than nickel-based batteries for their advantages that recharging can be done whenever it is convenient, the self-discharge rate is very low and the energy density is high.

The minimum unit of a battery may be referred to as a battery cell, and a battery module includes a set of battery cells connected in series. A cell voltage or a voltage across each battery cell corresponds to a state parameter to be essentially measured to ensure safety and efficiency of not only the battery cell but also the battery module and a high level equipment such as an electric vehicle including the battery module.

A battery monitoring circuit, one component of a battery management system, is connected to each of a positive terminal and a negative terminal of each battery cell included in the battery module through a wire harness, and plays a role in measuring the cell voltage for each battery cell, and transmitting voltage data indicating the measured cell voltage to a micro control unit (MCU).

The number of battery cells included in the battery module is not fixed, and ranges from a few battery cells to a few tens of battery cells according to the purpose of use of the battery module.

Since it is not efficient to manufacture each circuit board according to the specification of the battery module, it is necessary to employ a circuit board and a battery monitoring circuit having a sufficiently large number of voltage sensing paths for as wide coverage of battery modules as possible.

FIG. 1 shows the battery module including battery cells and the battery monitoring circuit having voltage sensing channels connected through the wire harness and the circuit board. For convenience of description, the number of battery cells is 12 and the number of voltage sensing channels is 14.

Referring to FIG. 1, the battery monitoring circuit includes fifteen voltage sensing pins P[1]~P[15], and the circuit board includes fifteen conducting patterns R[1]~R[15] and fifteen board terminals T[1]~B[15] having a one-to-one correspondence with the voltage sensing pins P[1]~P[15] of the battery monitoring circuit. One voltage sensing channel works every two adjacent voltage sensing pins (for example, P[2] and P[3]) among the voltage sensing pins P[1]~P[15], so the battery monitoring circuit includes a total of fourteen voltage sensing channels which is more than the number of battery cells C[1]~C[12] included in the battery module.

The wire harness includes thirteen wires W[1]~W[13] that are larger than the number of battery cells by one. The wires W[1]~W[13] are connected, at one end, to each of connection terminals A[1]~A[13] and at the other end, to the board terminals T[1]~B[13].

The twelve battery cells C[1]~C[12] may be connected in a one-to-one relationship to the twelve voltage sensing channels in a sequential order from the bottommost (lowest potential) voltage sensing channel among the fourteen voltage sensing channels of the battery monitoring circuit through the wire harness and the circuit board, and the remaining two voltage sensing channels formed by the top three voltage sensing pins P[13], P[14] and P[15] may stay in open state.

A battery monitoring circuit having no particular constraint condition may normally measure the cell voltage of each battery cell even when two voltage sensing channels formed by the top three voltage sensing pins P[13], P[14] and P[15] are in open state like the connection structure shown in FIG. 1.

However, some battery monitoring circuits supplied by many manufacturers are employed due to their high performance but have a constraint condition for a predetermined number of voltage sensing channels in a sequential order from the top (highest potential). That is, to measure the cell voltage V[1]~V[12], it is necessary to apply a predetermined level or more of voltage to each of the predetermined number of voltage sensing channels from the top to normally operate the battery monitoring circuit. When the top two voltage sensing channels stay in open state as shown in FIG. 1, the battery monitoring circuit having the constraint condition cannot normally operate, and as a result, it is impossible to measure the cell voltage of any of the twelve battery cells C[1]~C[12].

FIG. 2 shows a modified connection mechanism of the wire harness to connect a predetermined number of top battery cells to a predetermined number of top voltage sensing channels of the battery monitoring circuit to solve the above-described problem caused by the constraint condition of the battery monitoring circuit. Specifically, when compared with the wire harness of FIG. 1, the wire harness of FIG. 2 further includes an additional wire WX and a relay board connection terminal BX, and in the same way as FIG. 1, the bottom ten battery cells C[1]~C[10] are connected to the bottom eleven voltage sensing pins P[1]~P[11] in a sequential order through eleven wires W[1]~W[11], eleven board terminals T[1]~B[11] and eleven conducting patterns R[1]~R[11] and the top two battery cells C[11], C[12] are connected to the top three voltage sensing pins P[13]~P[15] in a sequential order through three wires WX, W[12], W[13], three board terminals T[13], B[14], B[15] and three conducting patterns R[13], R[14], R[15]. As opposed to FIG. 1, two intermediate voltage sensing channels formed by the three voltage sensing pins P[11]~P[13] are in open state, but the constraint condition for the top two voltage sensing channels formed by the three voltage sensing pins P[13]~P[15] is satisfied, so the cell voltage measurement operation for the twelve battery cells C[1]~C[12] may be normally performed.

To establish the connection relationship shown in FIG. 2, it requires a structure in which the ends of two wires W[11] and WX in the wire harness are connected to an electrode terminal of a specific battery cell by inserting the ends of the two wires into a single hole of the connection terminal A[11], and simultaneously the two wires are branched within the wire harness so that the two wires can be connected to two different terminals T[11], T[13] of the circuit board respectively. However, to manufacture the wire harness of the corresponding structure, it requires a process of changing a hole size of the connection terminal A[11] and a wire dimension, and inserting the two wires W[11], WX into the single hole, causing high complexity, an unnecessary cost rise and an increase in manufacturing time.

SUMMARY

Technical Problem

The present disclosure is designed to solve the above-described problem, and therefore the present disclosure is directed to providing a circuit board that satisfies a constraint condition of a battery monitoring circuit without changing a hole size and a wire dimension of a wire harness and can be applied to a wide coverage of battery modules.

These and other objectives and advantages of the present disclosure may be understood by the following description and will be apparent from embodiments of the present disclosure. In addition, it will be readily understood that the objectives and advantages of the present disclosure may be realized by the means set forth in the appended claims and a combination thereof.

Technical Solution

A circuit board according to an aspect of the present disclosure is for a battery monitoring circuit. The battery monitoring circuit includes first to (M+1)-th voltage sensing pins, operating on a condition that a voltage is applied to (M−N+1) to (M+1)-th voltage sensing pins among the first to (M+1)-th voltage sensing pins. The circuit board includes first to (M+1)-th conducting patterns formed electrically separably from each other, and each of the first to (M+1)-th conducting patterns electrically connected, at an end, to each of the first to (M+1)-th voltage sensing pins, respectively; a relay conducting pattern, wherein an end of the relay conducting pattern is electrically connected to (M−N+1)-th conducting pattern electrically connected to the (M−N+1)-th voltage sensing pin among the first to (M+1)-th conducting patterns; first to (M+1)-th board terminals, each of the first to (M+1)-th board terminals being electrically connected to an opposite end of each of the first to (M+1)-th conducting patterns respectively; and a relay board terminal electrically connected to an opposite end of the relay conducting pattern. M is a natural number of 3 or greater, and N is a natural number of less than M.

The first to (M+1)-th board terminals may be spaced apart from each other in a sequential order corresponding to an order of the first to (M+1)-th voltage sensing pins.

The circuit board may have a first surface in which battery monitoring circuit is mounted and a second surface opposite the first surface, and the first to (M+1)-th conducting patterns and the relay conducting pattern may be formed on the first surface of the circuit board.

The relay conducting pattern may be formed in a gap between a (M−N)-th conducting pattern and the (M−N+1)-th conducting pattern among the first to (M+1)-th conducting patterns on the first surface of the circuit board.

The relay board terminal may be disposed in a gap between the (M−N)-th board terminal and the (M−N+1)-th board terminal among the first to (M+1)-th board terminals.

The relay board terminal may be disposed to form an opposing relationship with the (M−N+1)-th board terminal in a thickness direction of the circuit board.

An apparatus comprising: the circuit board according to claim 1 and a wire harness for connecting the circuit board to a battery module. The battery module includes first to L-th battery cells connected in series. The wire harness includes a first connector including first to (L+1)-th cell connection terminals; a second connector including first to (L+1)-th board connection terminals, a first relay board connection terminal and a second relay board connection terminal; first to (L+1)-th wires; and a relay wire. A k-th wire among the first to (L+1)-th wires electrically connects a k-th cell connection terminal among the first to (L+1)-th cell connection terminals to a k-th board connection terminal among the first to (L+1)-th cell connection terminals. The first relay board connection terminal and the second relay board connection terminal are electrically connected by the relay wire. L is a natural number equal to or greater than N or smaller than M, and k is a natural number of (L+1) or smaller.

The first relay board connection terminal may be electrically connected to the relay board terminal of the circuit board. The second relay board connection terminal may be electrically connected to the (L−N+1)-th board terminal among the first to (M+1)-th board terminals of the circuit board.

Each of the first to (L−N)-th board connection terminals among the first to (L+1)-th board connection terminals may be electrically connected to each of the first to (L−N)-th board terminals among the first to (M+1)-th board terminals, respectively.

Each of the (L−N+1) to (L+1)-th board connection terminals among the first to (L+1)-th board connection terminals may be electrically connected to each of the (M−N+1) to (M+1)-th board terminals among the first to (M+1)-th board terminals.

The k-th cell connection terminal among the first to (L+1)-th cell connection terminals may be electrically connected to a negative terminal of the k-th battery cell among the first to L-th battery cells.

The (L+1)-th cell connection terminal may be electrically connected to a positive terminal of the L-th battery cell.

Advantageous Effects

According to at least one of the embodiments of the present disclosure, it may be possible to provide the circuit board that satisfies the constraint condition of the battery monitoring circuit without changing the hole size and the wire dimension of the wire harness and can be applied to a wide coverage of battery modules.

Additionally, according to at least one of the embodiments of the present disclosure, it may be possible to provide the wire harness for transmitting the cell voltage of the plurality of battery cells of the battery module to the circuit board according to the pattern structure of the circuit board applicable to a wide coverage of battery modules.

The effects of the present disclosure are not limited to the above-mentioned effects, and these and other effects will be clearly understood by those skilled in the art from the appended claims.

BRIEF DESCRIPTION OF THE DRAWINGS

The accompanying drawings illustrate exemplary embodiments of the present disclosure and together with the following detailed description, serve to provide a further understanding of the technical aspect of the present disclosure, and thus the present disclosure should not be construed as being limited to the drawings.

DETAILED DESCRIPTION

The detailed description of the objectives and technical features of the present disclosure and the technical effects will be understood more clearly by the following detailed description in accordance with the accompanying drawings. The embodiments according to the present disclosure will be described in detail with reference to the accompanying drawings.

The embodiments disclosed herein should not be interpreted or used to limit the scope of the present disclosure. It is obvious to those skilled in the art that the description including the embodiments of the present disclosure has many different variations. Accordingly, arbitrary embodiments described in the detailed description of the present disclosure are provided for illustration purposes to describe the present disclosure better but not intended to limit the scope of the present disclosure to the disclosed embodiments.

The terms including the ordinal number such as "first", "second" and the like, are used to distinguish one element from another among various elements, but not intended to limit the elements.

Additionally, the term "comprises" is "open-ended" language and specifies the presence of stated elements, but does not preclude the presence or addition of one or more other elements.

Further, it should be understood that when an element is referred to as being "connected to" another element, it can be directly connected to the other element or intervening elements may be present.

Figure 1:
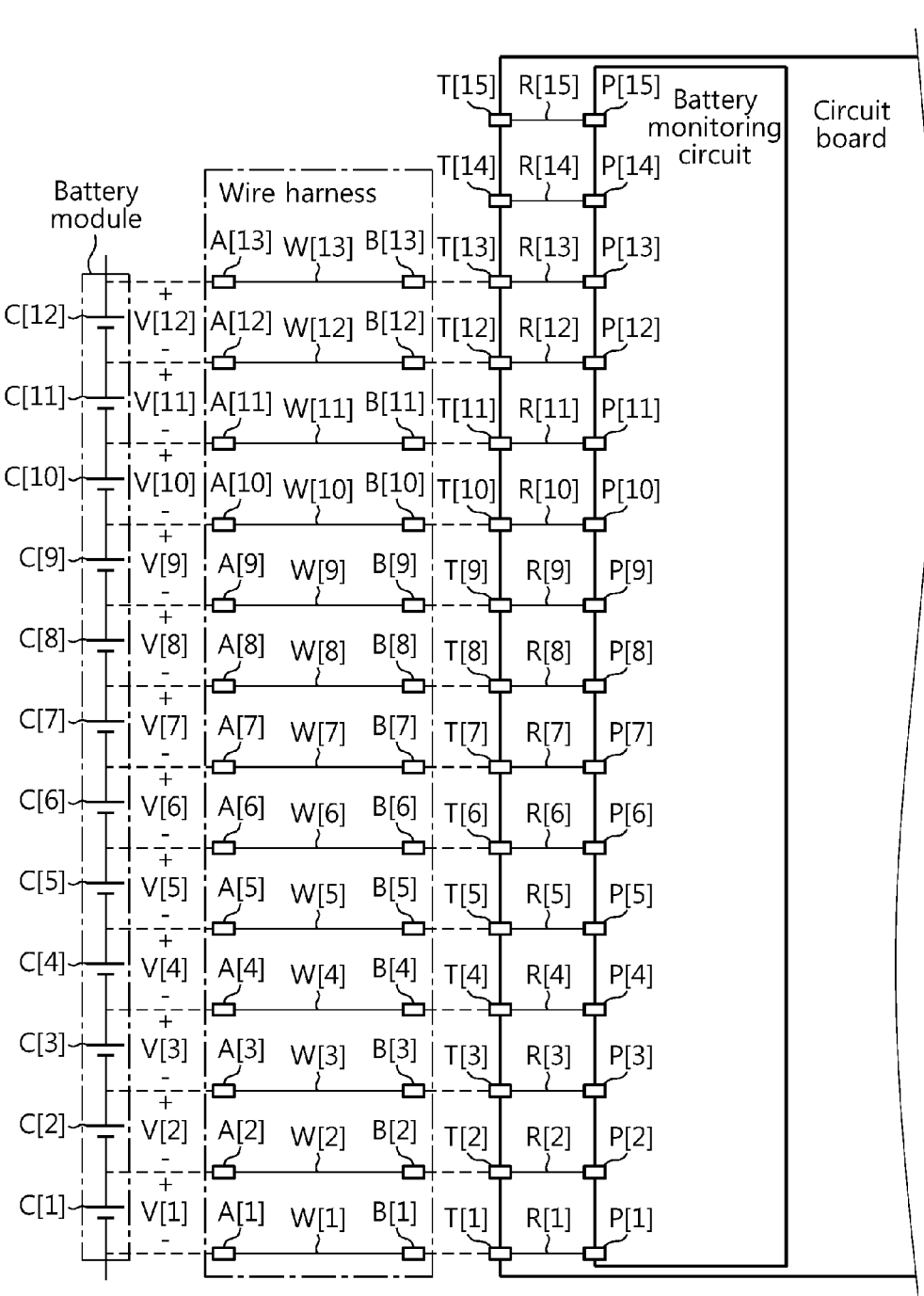
FIG. 1 is a diagram exemplarily showing that a battery monitoring circuit having no constraint condition associated with a predetermined number of top voltage sensing channels is connected to a battery module through a wire harness and a circuit board.
Figure 2:
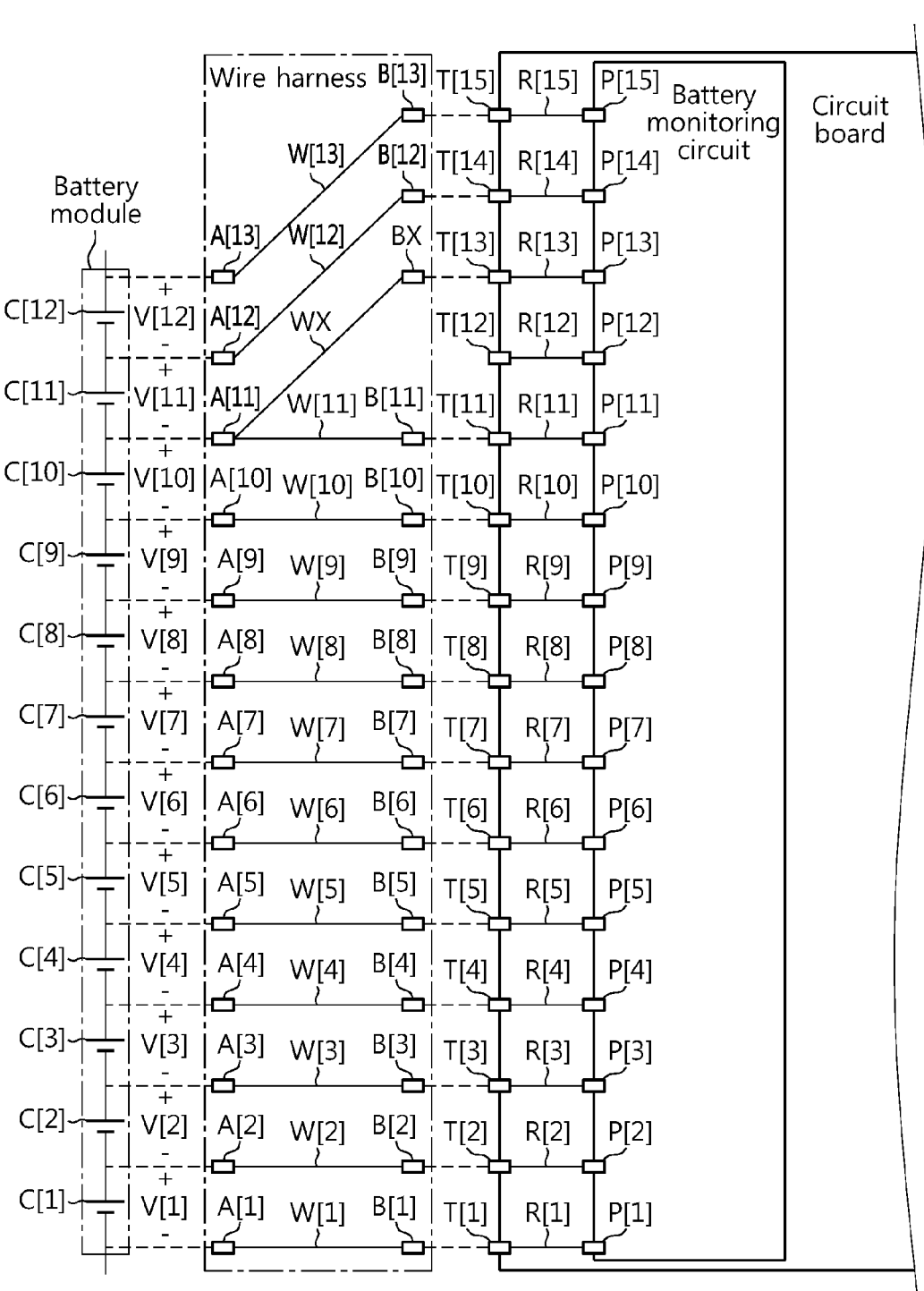
FIG. 2 is a diagram exemplarily showing a circuit board having a battery monitoring circuit having a constraint condition associated with a predetermined number of top voltage sensing channels is mounted is connected to a battery module through a wire harness having a changed connection mechanism.
Figure 3:
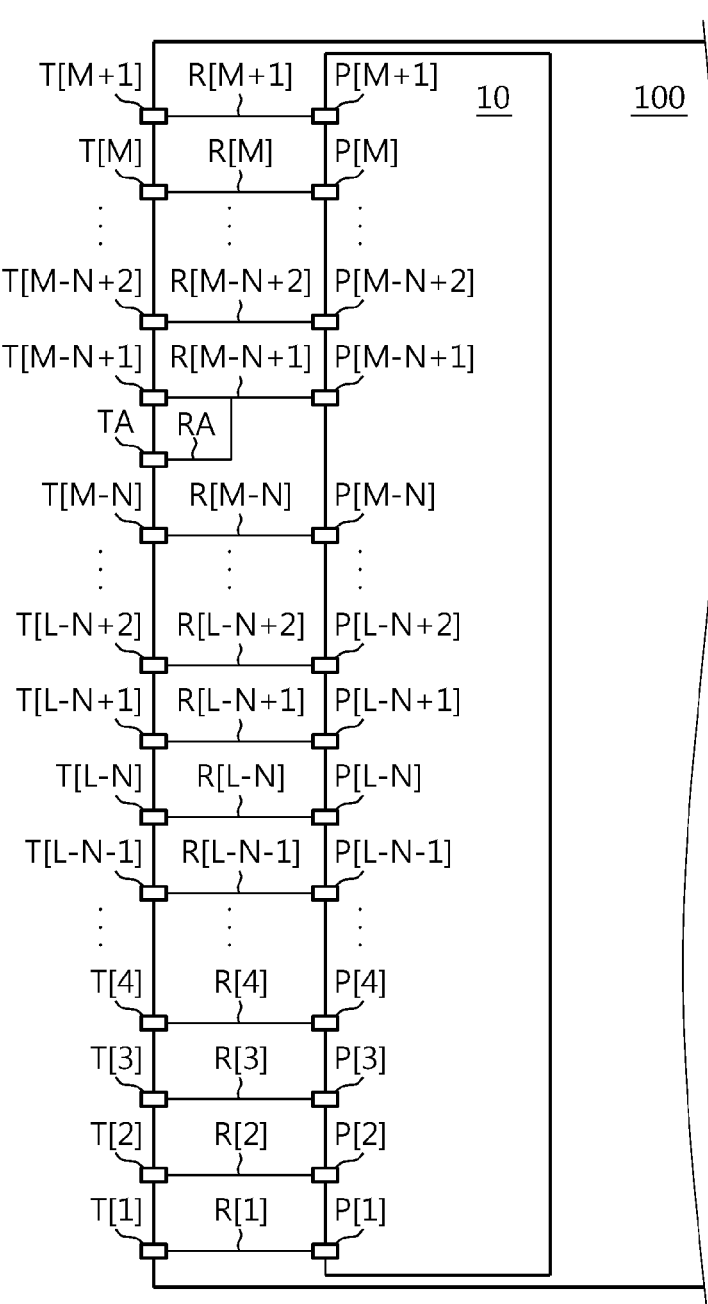
FIG. 3 is a diagram exemplarily showing a circuit board according to an embodiment of the present disclosure.

FIG. 3 is a diagram exemplarily showing a circuit board 100 according to an embodiment of the present disclosure. In FIG. 3, the circuit board 100 is equipped with a battery monitoring circuit 10 having a constraint condition for top N voltage sensing channels. Here, N is a natural number of less than M.

Referring to FIG. 3, the battery monitoring circuit 10 may be referred to as 'BMIC', and basically includes a voltage measurement circuit (not shown) to measure the cell voltage, and may further include at least one functional circuit. The functional circuit may include, for example, a temperature measurement circuit, a cell balancing circuit or the like.

The battery monitoring circuit 10 includes first to (M+1)-th voltage sensing pins P[1]~P[M+1]. Here, M is a natural number of 3 or greater.

Among the first to (M+1)-th voltage sensing pins P[1]~P[M+1], a pair of two adjacent voltage sensing pins form one voltage sensing channel. When i is a natural number of M or smaller, the i-th voltage sensing pin P[i] and the (i+1)-th voltage sensing pin form the i-th voltage sensing channel. For reference, the i-th voltage sensing pin P[i] has lower potential than the (i+1)-th voltage sensing pin P[i+1], and a voltage difference between the i-th voltage sensing pin P[i] and the (i+1)-th voltage sensing pin P[i+1] is measured as the cell voltage. Accordingly, the first to (M+1)-th voltage sensing pins P[1]~P[M+1] form a total of M voltage sensing channels, and may correspond to a battery module including a maximum of M battery cells through the M voltage sensing channels.

The battery monitoring circuit 10 has the constraint condition for top N voltage sensing channels as described above. That is, the operating condition (condition for cell voltage measurement) of the battery monitoring circuit 10 is an event of applying voltage to the (M−N+1) to (M+1)-th voltage sensing pins P[M−N+1]~P[M+1] among the first to (M+1)-th voltage sensing pins P[1]~P[M+1]. Accordingly, it is necessary to apply a predetermined level or more of voltage to each of the (M−N+1) to M-th voltage channels in order to measure the voltage in each of M voltage sensing channels. The (M−N+1)-th voltage sensing pin P[M−N+1] corresponds to the lowest potential among (N+1) voltage sensing pins P[M−N+1]~P[M+1]) having the constraint condition.

The circuit board 100 has a first surface and a second surface opposite the first surface in the thicknesswise direction, and the battery monitoring circuit 10 is mounted on a circuit mounting area on the first surface of the circuit board 100.

The circuit board 100 includes first to (M+1)-th conducting patterns R[1]~R[M+1] formed electrically separably from each other.

The first to (M+1)-th conducting patterns R[1]~R[M+1] is, at one end, electrically connected to the first to (M+1)-th voltage sensing pins P[1]~P[M+1]) of the battery monitoring circuit 10 in a one-to-one relationship, respectively. In this instance, the i-th conducting pattern R[i] may directly contact the i-th voltage sensing pin P[i] or may be indirectly connected to the i-th voltage sensing pin P[i] through Surface Mounter Technology (SMT).

In addition to the first to (M+1)-th conducting patterns R[1]~R[M+1], the circuit board 100 further includes a relay conducting pattern RA. One end of the relay conducting pattern RA is electrically connected to the (M−N+1)-th conducting pattern R[M−N+1].

The circuit board 100 further includes a terminal array. The terminal array includes first to (M+1)-th board terminals T[1]~T[M+1] and a relay board terminal TA.

The first to (M+1)-th conducting patterns R[1]~R[M+1]) are, at the other end, electrically connected to the first to (M+1)-th board terminals T[1]~T[M+1] in a one-to-one relationship, respectively. In this instance, the first to (M+1)-th board terminals T[1]~T[M+1] may be spaced apart from each other in a sequential order corresponding to the order of location of the first to (M+1)-th voltage sensing pins P[1]~P[M+1].

The other end of the relay conducting pattern RA is electrically connected to the relay board terminal TA. The relay board terminal TA may be disposed in the gap between the (M–N)-th board terminal T[M–N] and the (M–N+1)-th board terminal T[M–N+1] among the first to (M+1)-th board terminals T[1]~T[M+1].

According to FIG. 3, the first to (M+1)-th conducting patterns R[1]~R[M+1] and the relay conducting pattern RA may be formed in any one of the first surface and the second surface opposite the first surface in the thicknesswise direction of the circuit board 100. At least one of the first to (M+1)-th conducting patterns R[1]~R[M+1] and the relay conducting pattern RA may be formed on the first surface and the remaining conducting patterns may be formed on the second surface.

Figure 4:
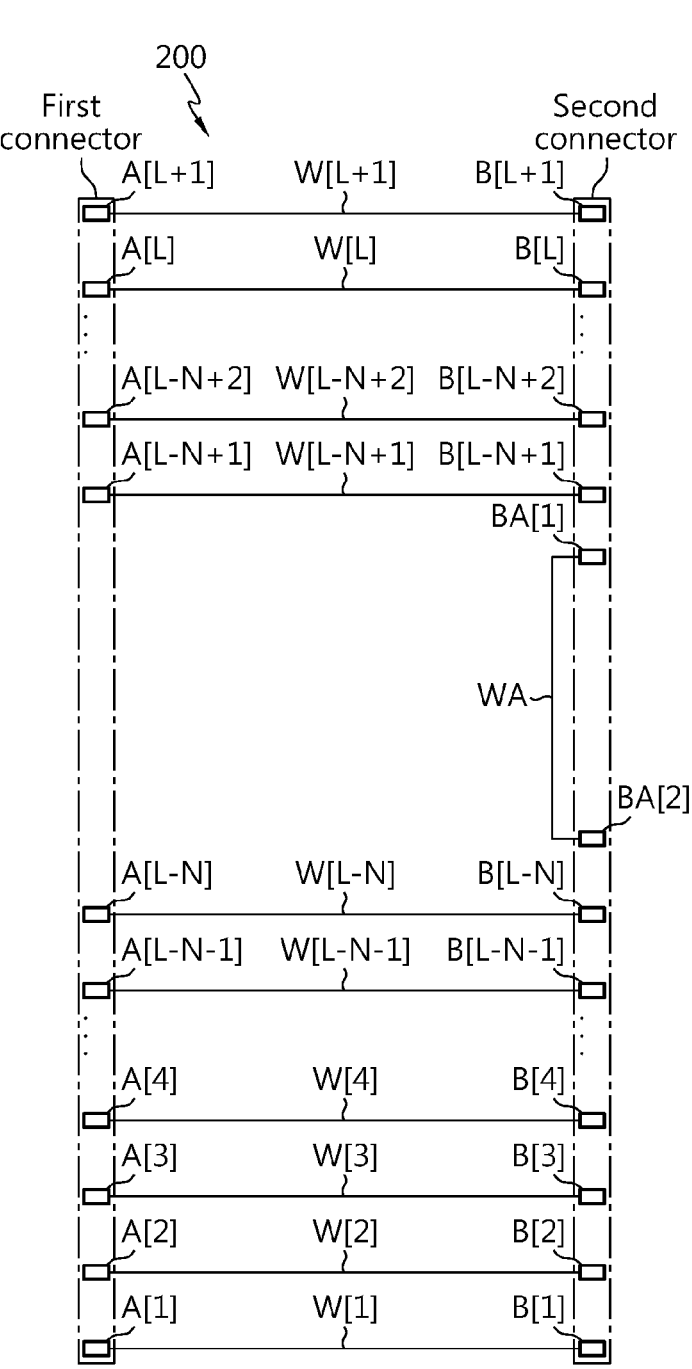
FIG. 4 is a diagram exemplarily showing a wire harness according to an embodiment of the present disclosure.

FIG. 4 is a diagram exemplarily showing a wire harness 200 according to an embodiment of the present disclosure.

Referring to FIG. 4, the wire harness 200 is configured to connect the circuit board 100 described with reference to FIG. 3 to the battery module BM (see FIG. 5).

The wire harness 200 includes a first connector, a second connector and a connection portion.

The first connector is used for mechanical and electrical coupling between the wire harness 200 and the battery module BM, and includes first to (L+1)-th cell connection terminals A[1]~A[L+1]. For reference, L is a natural number of greater than N and smaller than M, and may be equal to the number of battery cells included in the battery module BM coupled to the first connector.

The second connector is used for mechanical and electrical coupling between the wire harness 200 and the circuit board 100, and includes first to (L+1)-th board connection terminals B[1]~B[L+1], a first relay board connection terminal BA[1] and a second relay board connection terminal BA[2]. The first relay board connection terminal BA[1] and the second relay board connection terminal BA[2] may be disposed in the separation area between the (L–N+1)-th board connection terminal B[L–N+1] and the (L–N)-th board connection terminal B[L–N].

The connection portion is used for mechanical and electrical coupling between the first connector and the second connector, and includes first to (L+1)-th wires W[1]~W[L+1] and a relay wire WA.

When k is a natural number of (L+1) or smaller a k-th wire W[k] among first to (L+1)-th wires W[1]~W[L+1] electrically connects a k-th cell connection terminal A[k] among the first to (L+1)-th cell connection terminals A[1]~A[L+1] to a k-th board connection terminal B[k] among the first to (L+1)-th board connection terminals B[1]~B[L+1].

The relay wire WA electrically connects the first relay board connection terminal BA[1] to the second relay board connection terminal BA[2]. The first relay board connection terminal BA[1] and the second relay board connection terminal BA[2] have substantially the equal potential by the relay wire WA.

Figure 5:
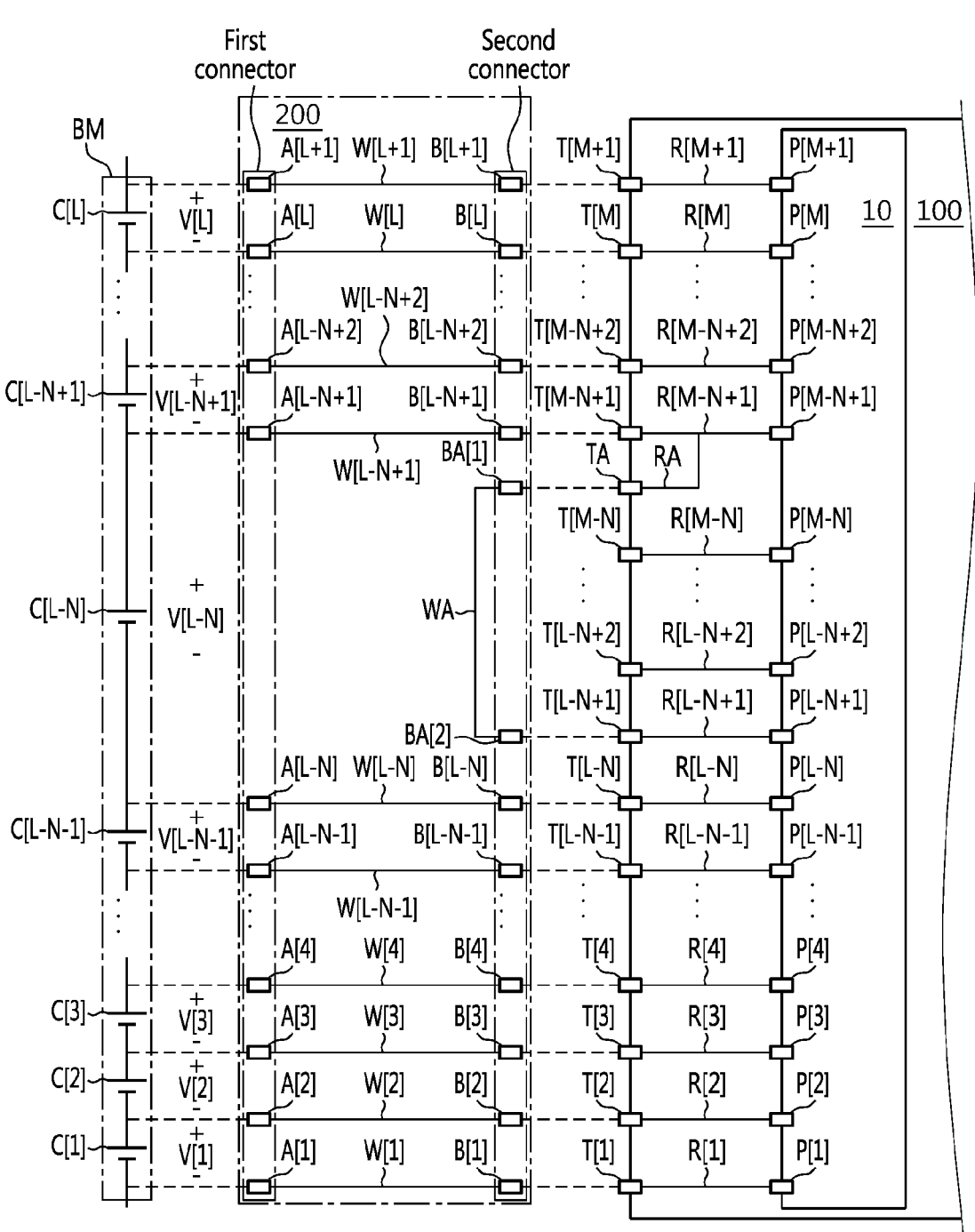
FIG. 5 is a diagram exemplarily showing that a battery module (BM) including a plurality of battery cells connected in series is connected to the circuit board shown in FIG. 3 through the wire harness shown in FIG. 4.

FIG. 5 is a diagram exemplarily showing the battery module BM including the plurality of battery cells connected in series is connected to the circuit board 100 shown in FIG. 3 through the wire harness 200 shown in FIG. 4. For convenience of description, in FIG. 5, M is larger than L by 3 or more, and L is larger than N by 4 or more.

Referring to FIG. 5, the battery module BM includes first to L-th battery cells C[1]~C[L] connected in series.

Among the first to L-th battery cells C[1]~C[L], the negative terminal of the first battery cell C[1] has the lowest potential and the positive terminal of the L-th battery cell C[L] has the highest potential. In this instance, among two adjacent battery cells (for example, C[1] and C[2]), the negative terminal of the upper battery cell (for example, C[2]) is electrically connected to the positive terminal of the other battery cell (for example, C[1]).

When the first connector of the wire harness 200 is coupled to the battery module BM, the positive and negative terminals of the first to L-th battery cells C[1]~C[L] are electrically connected to the first to (L+1)-th cell connection terminals A[1]~A[L+1] of the wire harness 200.

Specifically, among the first to (L+1)-th cell connection terminals A[1]~A[L+1], the k-th cell connection terminal A[k] may be electrically connected to the negative terminal of the k-th battery cell C[k] among the first to L-th battery cells C[1]~C[L]. The (L+1)-th cell connection terminal may be electrically connected to the positive terminal of the L-th battery cell C[L].

When the second connector of the wire harness 200 is coupled to the circuit board 100, the first relay board connection terminal BA[1] is electrically connected to the relay board terminal TA of the circuit board 100, and the second relay board connection terminal BA[2] is electrically connected to the (L–N+1)-th board terminal T[L–N+1] among the first to (M+1)-th board terminals T[1]~T[M+1] of the circuit board 100.

When the second connector of the wire harness 200 is coupled to the circuit board 100, the first to (L–N)-th board connection terminals B[1]~B[L-N] among the first to (L+1)-th board connection terminals B[1]~B[L+1] are electrically connected to the first to (L–N)-th board terminals T[1]~T[L-N] among the first to (M+1)-th board terminals T[1]~T[M+1] in a one-to-one relationship.

Accordingly, among the first to L-th battery cells C[1]~C[L], the cell voltage V[1]~V[L–N–1] of each of the first to (L–N–1)-th battery cells C[1]~C[L–N–1] is transmitted to the first to (L–N–1)-th voltage sensing channels of the battery monitoring circuit 10.

Additionally, when the second connector of the wire harness 200 is coupled to the circuit board 100, the first relay board connection terminal BA[1] of the wire harness 200 is electrically connected to the relay board terminal TA of the circuit board 100, and the second relay board connection terminal BA[2] of the wire harness 200 is electrically connected to the (L–N+1)-th board terminal T[L–N+1] of the circuit board 100.

The positive terminal of the (L–N)-th battery cell C[L–N] is electrically connected to the (L–N+1)-th voltage sensing pin P[L–N+1] of the battery monitoring circuit 10 through the (L–N+1)-th cell connection terminal A[L–N+1], the (L–N+1)-th wire W[L–N+1], the (L–N+1)-th board connection terminal B[L–N+1], the (M–N+1)-th board terminal T[M–N+1], the (M–N+1)-th conducting pattern R[M–N+1], the relay conducting pattern RA, the relay board terminal TA, the first relay board connection terminal BA[1], the relay wire WA, the second relay board connection terminal BA[2], the (L–N+1)-th board terminal T[L–N+1] and the (L–N+1)-th conducting pattern R[L–N+1].

Additionally, the negative terminal of the (L–N)-th battery cell C[L–N] is electrically connected to the (L–N) voltage sensing pin P[L–N] of the battery monitoring circuit 10 through the (L–N)-th cell connection terminal A[L–N], the (L–N)-th wire W[L–N], the (L–N)-th board connection terminal BI[L−N], the (L−N)-th board terminal T[L−N] and the (L−N)-th conducting pattern R[L−N].

Accordingly, the cell voltage V[L−N] of the (L−N)-th battery cell C[L−N] among the first to L-th battery cells C[1]~C[L] is transmitted to the (L−N)-th voltage sensing channel of the battery monitoring circuit 10 through two board terminals T[L−N+1] and T[L−N].

Additionally, when the second connector of the wire harness 200 is coupled to the circuit board 100, among the first to (L+1)-th board connection terminals B[1]~B[L+1], the (L−N+1) to (L+1)-th board connection terminals B[L−N+1]~B[L+1] are electrically connected to the (M−N+1) to (M+1)-th board terminals T[M−N+1]~T[M+1] among the first to (M+1)-th board terminals T[1]~T[M+1] in a one-to-one relationship.

Accordingly, among the first to L-th battery cells C[1]~C[L], the cell voltage V[L−N+1]~V[L] of each of the (L−N+1) to L-th battery cells C[L−N+1]~C[L]) is transmitted to the (M−N+1) to M-th voltage sensing channels of the battery monitoring circuit, and the constraint condition of the battery monitoring circuit 10 may be completely satisfied.

Through the above-described connection relationship, when the first connector and the second connector of the wire harness 200 are coupled to the battery module BM and the circuit board 100, respectively, the cell voltage of each of the first to (L−N−1)-th battery cells C[1]~C[L−N−1], the (L−N)-th battery cell C[L−N]) and the (L−N+1) to L-th battery cells C[L−N+1]~C[L] may be normally measured.

Meanwhile, when the second connector of the wire harness 200 is coupled to the circuit board 100, the (L−N+2) to (M−N)-th board terminals T[L−N+2]~T[M−N] of the circuit board 100 are in open circuited state, and voltage is not applied to the (L−N+2) to (M−N)-th voltage sensing pins P[L−N+2]~P[M−N], and accordingly the (M−L−2) voltage sensing channels and the (L−N+2) to (M−N)-th voltage sensing channels stay in open state.

The present disclosure is not limited to the above-described particular embodiments and variations, and it is obvious that modifications and variations may be made thereto by those having ordinary skill in the technical field pertaining to the present disclosure without departing from the claimed subject matter of the present disclosure, and such modifications and variations should not be understood as being separate from the technical aspect or scope of the present disclosure.

What is claimed is:

1. A circuit board for a battery monitoring circuit including first to (M+1)-th voltage sensing pins operating on a condition that a voltage is applied to (M−N+1) to (M+1)-th voltage sensing pins among the first to (M+1)-th voltage sensing pins, the circuit board comprising:

first to (M+1)-th conducting patterns formed electrically separably from each other, each of the first to (M+1)-th conducting patterns electrically connected, at an end, to each of the first to (M+1)-th voltage sensing pins, respectively;

a relay conducting pattern, wherein an end of the relay conducting pattern is electrically connected to (M−N+1)-th conducting pattern electrically connected to the (M−N+1)-th voltage sensing pin among the first to (M+1)-th conducting patterns;

first to (M+1)-th board terminals, each of the first to (M+1)-th board terminals being electrically connected to an opposite end of each of the first to (M+1)-th conducting patterns, respectively; and a relay board terminal electrically connected to an opposite end of the relay conducting pattern, wherein M is a natural number of 3 or greater, and wherein N is a natural number of less than M.

2. The circuit board according to claim 1, wherein the first to (M+1)-th board terminals are spaced apart from each other in a sequential order corresponding to an order of the first to (M+1)-th voltage sensing pins.

3. The circuit board according to claim 1, wherein the circuit board has a first surface in which the battery monitoring circuit is mounted and a second surface opposite the first surface, and the first to (M+1)-th conducting patterns and the relay conducting pattern are formed on the first surface of the circuit board.

4. The circuit board according to claim 3, wherein the relay conducting pattern is formed in a gap between a (M−N)-th conducting pattern and the (M−N+1)-th conducting pattern among the first to (M+1)-th conducting patterns on the first surface of the circuit board.

5. The circuit board according to claim 4, wherein the relay board terminal is disposed in a gap between the (M−N)-th board terminal and the (M−N+1)-th board terminal among the first to (M+1)-th board terminals.

6. The circuit board according to claim 4, wherein the relay board terminal is disposed to form an opposing relationship with the (M−N+1)-th board terminal in a thickness direction of the circuit board.

7. A wire harness for connecting the circuit board to a battery module including first to L-th battery cells connected in series, the wire harness comprising:

a first connector including first to (L+1)-th cell connection terminals;

a second connector including first to (L+1)-th board connection terminals, a first relay board connection terminal and a second relay board connection terminal;

first to (L+1)-th wires; and a relay wire, wherein a k-th wire among the first to (L+1)-th wires electrically connects a k-th cell connection terminal among the first to (L+1)-th cell connection terminals to a k-th board connection terminal among the first to (L+1)-th cell connection terminals, wherein the first relay board connection terminal and the second relay board connection terminal are electrically connected by the relay wire, wherein L is a natural number equal to or greater than N or smaller than M, and wherein k is a natural number of (L+1) or smaller.

8. The apparatus according to claim 7, wherein the first relay board connection terminal is electrically connected to the relay board terminal of the circuit board, and wherein the second relay board connection terminal is electrically connected to the (L−N+1)-th board terminal among the first to (M+1)-th board terminals of the circuit board.

9. The apparatus according to claim 7, wherein each of the first to (L−N)-th board connection terminals among the first to (L+1)-th board connection terminals are electrically connected to each of the first to (L−N)-th board terminals among the first to (M+1)-th board terminals, respectively, and wherein each of the (L−N+1) to (L+1)-th board connection terminals among the first to (L+1)-th board connection terminals are electrically connected to each of the (M−N+1) to (M+1)-th board terminals among the first to (M+1)-th board terminals.

10. The apparatus according to claim 7, wherein the k-th cell connection terminal among the first to (L+1)-th cell connection terminals is electrically connected to a negative terminal of the k-th battery cell among the first to L-th battery cells, and wherein the (L+1)-th cell connection terminal is electrically connected to a positive terminal of the L-th battery cell.

* * * * *